United States Patent
Tsujimoto

(10) Patent No.: US 10,120,001 B2
(45) Date of Patent: Nov. 6, 2018

(54) POWER FACTOR MEASUREMENT DEVICE

(71) Applicant: OSAKA CITY UNIVERSITY, Osaka (JP)

(72) Inventor: Hiroaki Tsujimoto, Osaka (JP)

(73) Assignee: OSAKA CITY UNIVERSITY, Osaka (JP)

( * ) Notice: Subject to any disclaimer, the term of this patent is extended or adjusted under 35 U.S.C. 154(b) by 988 days.

(21) Appl. No.: 14/400,023

(22) PCT Filed: May 9, 2013

(86) PCT No.: PCT/JP2013/002975
§ 371 (c)(1),
(2) Date: Feb. 4, 2015

(87) PCT Pub. No.: WO2013/168428
PCT Pub. Date: Nov. 14, 2013

(65) Prior Publication Data
US 2015/0219700 A1 Aug. 6, 2015

(30) Foreign Application Priority Data

May 11, 2012 (JP) ................................. 2012-110116

(51) Int. Cl.
*G01R 21/00* (2006.01)
*G01R 33/00* (2006.01)
(Continued)

(52) U.S. Cl.
CPC ........... *G01R 21/006* (2013.01); *G01R 21/08* (2013.01); *G01R 33/0029* (2013.01); *G01R 33/096* (2013.01)

(58) Field of Classification Search
CPC .... G01R 21/08; G01R 15/205; G01R 15/142; G01R 1/203; G01R 1/00; G01R 33/072; G01R 21/00; H01L 2221/00; H01H 1/00
(Continued)

(56) References Cited

U.S. PATENT DOCUMENTS 5,049,809 A 9/1991 Wakatsuki et al.
6,556,007 B1 4/2003 Abe et al.
(Continued)

FOREIGN PATENT DOCUMENTS

CN 1487501 A 4/2004
CN 102023244 A 4/2011
(Continued)

OTHER PUBLICATIONS

International Search Report for Application No. PCT/JP2013/002975 dated Aug. 13, 2013.
(Continued)

*Primary Examiner* — Melissa Koval
*Assistant Examiner* — Trung Nguyen
(74) *Attorney, Agent, or Firm* — Pearne & Gordon LLP

(57) ABSTRACT

A small-sized power factor measurement apparatus capable of measuring a power factor by one element is desired. The power factor measurement apparatus includes a pair of coupling ends (12) for coupling to a power supply in parallel with a load, two magnetic elements (21, 22) whose changes in electric resistance are different from each other due to the same external magnetic field, a pair of measurement terminals (13) for outputting a differential voltage between the two magnetic elements, a power factor sensor (10) including a pair of sensor terminals (10t) connected to the pair of coupling ends (12), a voltage detector (15) for measuring a voltage between the measurement terminals (13), a low-pass filter (16) connected to the output of the voltage detector
(Continued)

(15), a high-pass filter (17) connected to the output of the voltage detector (15), a rectifier (18) connected to the high-pass filter (17), and a divider (19) for dividing the output of the low-pass filter (16) and the output of the rectifier (18).

12 Claims, 9 Drawing Sheets

(51) Int. Cl.
 *G01R 33/09* (2006.01)
 *G01R 21/08* (2006.01)
(58) Field of Classification Search
 USPC ... 324/76.11, 200, 207.21, 244–258, 750.21, 324/750.12, 754.17, 754.29, 500, 600; 327/510, 511
 See application file for complete search history.

(56) References Cited

U.S. PATENT DOCUMENTS

| | | | |
|---|---|---|---|
| RE42,161 E * | 2/2011 | Hochstein | H02J 9/065 323/282 |
| 2003/0214762 A1 | 11/2003 | Sharma et al. | |
| 2006/0227518 A1 | 10/2006 | Nishio et al. | |
| 2011/0074382 A1 | 3/2011 | Patel | |
| 2011/0221436 A1* | 9/2011 | Ichinohe | G01R 15/205 324/252 |
| 2012/0229131 A1 | 9/2012 | Takenaga et al. | |
| 2014/0062471 A1 | 3/2014 | Deak et al. | |

FOREIGN PATENT DOCUMENTS

| | | |
|---|---|---|
| CN | 202066953 U | 12/2011 |
| EP | 1 666 894 A1 | 6/2006 |
| JP | 64-74457 A | 3/1989 |
| JP | H02-120677 | 5/1990 |
| JP | H03-261394 | 11/1991 |
| JP | H07-291464 | 11/1995 |
| JP | 2001-074788 A | 3/2001 |
| JP | 2002-310659 A | 10/2002 |
| JP | 4023997 B2 | 12/2007 |
| JP | 2008-039734 A | 2/2008 |
| JP | 2011-038874 A | 2/2011 |
| JP | 2011-47731 A | 3/2011 |
| JP | 2012-078232 | 4/2012 |

OTHER PUBLICATIONS

Hiroaki Tsujimoto, Yosuke Tsuzaki, "Magentic thin film power sensor using a magneto resistance effect", The Institute of Electrical Engineers of Japan Kenkyukai Shiryo. MAG, Magnetics Kenkyukai, Nov. 24, 2011 (Nov. 24, 2011).

Chinese Office Action and Search Report for Application No. 201380036790.2 dated Jun. 3, 2016.

Office Action issued in Japanese Patent Application No. 2012-110116 dated Aug. 30, 2016.

Supplementary European Search Report issued in Application No. EP 13 78 8379 dated May 4, 2016.

Japanese Office Action dated Feb. 9, 2016 for Japanese Patent Application No. JP-2012-110116.

Office action issued in Indian Patent Application No. IN 8935/CHENP/2014 dated Jun. 1, 2018.

* cited by examiner

POWER FACTOR MEASUREMENT DEVICE

TECHNICAL FIELD

The present invention relates to an apparatus for measuring a power factor of consumed power in an electric circuit having an inductive load, and particularly to a power factor measurement apparatus using magnetoresistive effects of a magnetic film.

BACKGROUND ART

When a load having a reactance component is driven by use of an AC power supply, a phase difference is generated between voltage and current. Consumed power causes active power and reactive power due to the phase difference. An increase in reactive power does not lead to effective use of the power supply, and thus it is desirable that reactive power is reduced and active power is increased.

A rate of active power relative to power supplied from a power supply is called power factor, and is typically expressed as cos θ. Herein, θ is a phase difference between current and voltage. In order to increase active power as much as possible, a power factor in a power consumption circuit needs to be measured and the circuit needs to be adjusted so as to increase the power factor. In particular, since the power factor directly displays a current drive efficiency, it is desired that the power factor is enhanced for efficient driving and that the power factor is directly measured, in terms of power saving.

In many cases, however, the power factor of power consumed in the circuit is obtained by measuring reactive power. This is found by taking a product of the voltage and current signals mutually shifted by 90° phase. To shift 90° phase, a component such as transformer or integration circuit has been used. However, the method has a problem that calculations of reactive power are complicated during a load variation.

In order to solve the problem, in Patent Literature 1, there are provided a sampling means for sampling a voltage and a current of an AC circuit, a memory means for storing voltage data and current data sampled by the sampling means per sampling point, and a pseudo reactive power calculation means for calculating reactive power from the voltage data and the current data stored in the memory means, in which the memory means stores the voltage data and the current data in the same phase for one cycle, and the pseudo reactive power calculation means cyclically multiplies the voltage data and the current data for a predetermined cycle stored in the memory means by current data at each sampling point and voltage data at a sampling point shifted therefrom by 90° phase, respectively, thereby calculating reactive power based on the average of the multiplication values.

CITATION LIST

Patent Literature

Patent Literature 1: JP 2001-074788 A

SUMMARY OF INVENTION

Technical Problem

A power factor needs to be measured at various points in terms of power saving or when power is used to drive a mobile object such as vehicle. In order to meet such a demand, a power factor measurement apparatus having a small-sized sensor and a simple measurement module is required.

The power factor measurement apparatus disclosed in Patent Literature 1 is assumed to be able to calculate reactive power in a relatively simple structure, but a sampling means for sampling a voltage and a current of an AC circuit is required, and thus a size of the measurement apparatus, especially the sensor cannot be downsized. Further, if the current sampling means is tried to be arranged after the circuits are connected, the connection line needs to be clamped, and there occurs a problem that it is not easy to arrange the sampling means for the connection line embedded and provided in a trench on a wall. Further, the method in Patent Literature 1 has a problem that a power factor cannot be directly measured.

Solution to Problem

The present invention has been made in terms of the above problems, and is directed for a power factor measurement apparatus using magnetoresistive effects of a magnetic film. More specifically, the power factor measurement apparatus according to the present invention is directed for measuring a power factor of power consumed in a load connected to a power supply via a connection line, and is characterized by including:

a pair of coupling ends that couples to the power supply in parallel with the load;

a power factor sensor having:
  two magnetic elements whose resistance changes due to an identical external magnetic field are different from each other;
  a pair of measurement terminals that outputs a differential voltage of the two magnetic elements; and
  a pair of sensor terminals connected to the pair of coupling ends, respectively;

a voltage detector that measures a voltage between the measurement terminals;

a low-pass filter connected to an output of the voltage detector;

a high-pass filter connected to the output of the voltage detector;

a rectifier connected to the high-pass filter; and a divider for dividing an output of the low-pass filter and an output of the rectifier.

Advantageous Effects of Invention

The power factor measurement apparatus according to the present invention can directly measure a power factor in detail in an inductive motor by effectively using the advantages of a magnetic thin film power sensor such as non-contact (principle), easy installation (ultracompact and thin) and saved power (less consumed energy on measurement). Therefore, it becomes possible to visualize a power consuming situation, and by applying the present invention to a circuit having a reactance component such as inductive motor, thereby controlling power saving drive depending on an operation situation or load situation.

DESCRIPTION OF EMBODIMENTS

A power factor measurement apparatus according to the present invention will be described below with reference to the drawings. The following description exemplifies embodiments according to the present invention, and the present invention is not limited to the following embodiments. The following embodiments may be modified without departing from the scope of the present invention.

First Embodiment

Figure 1:
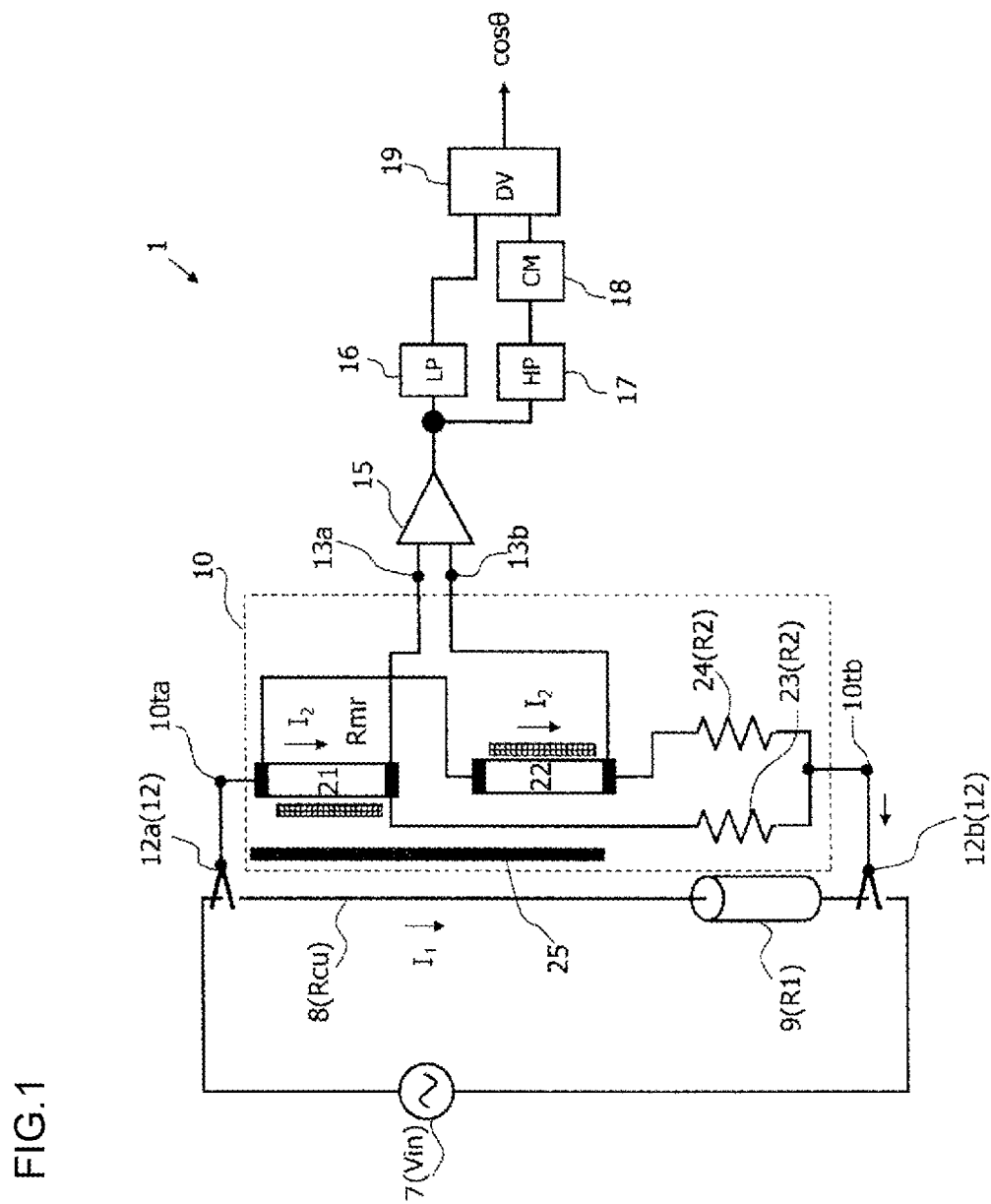
FIG. 1 is a diagram illustrating a structure of a power factor measurement apparatus according to the present invention.

FIG. 1 illustrates a structure of a power factor measurement apparatus according to the present invention. The power factor measurement apparatus 1 according to the present invention includes coupling ends 12, a power factor sensor 10, a voltage detector 15, a low-pass filter 16, a high-pass filter 17, a rectifier 18, and a divider 19. The power factor measurement apparatus 1 according to the present invention measures a power factor of power consumed at a load 9 (its resistance value is R1) connected to a power supply 7. Herein, the power supply 7 is AC-powered. The power supply 7 is connected with the load 9 via a connection line 8 (its resistance value is Rcu).

The coupling ends 12 are terminals for connecting the power factor sensor 10 in the power factor measurement apparatus 1 to the power supply 7 in the circuit to be measured in parallel with the load 9. Therefore, the coupling ends 12 are paired, and are discriminated as the coupling ends 12a and 12b.

Figure 2:
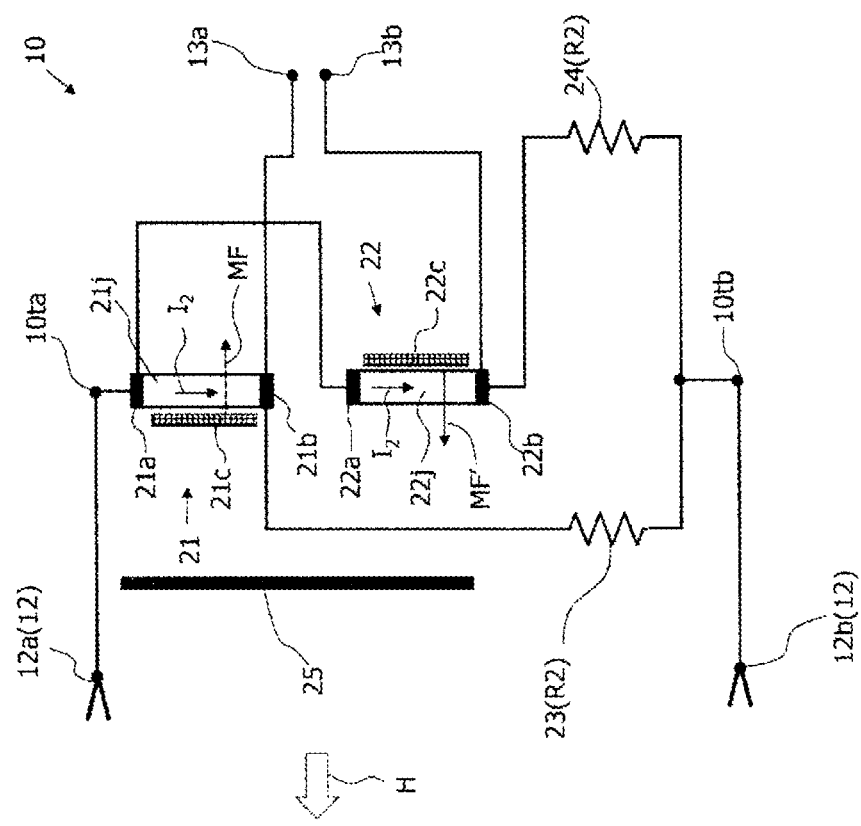
FIG. 2 is a diagram illustrating an enlarged power factor sensor according to the present invention.

FIG. 2 illustrates only the power factor sensor 10 and the coupling ends 12. The power factor sensor 10 is provided with terminals (measurement terminals 13: 13a and 13b) for combining two elements using magnetoresistive effects of a magnetic film and taking a differential output therebetween. Sensor terminals 10t (10ta and 10tb) connected to the coupling ends 12 are provided. The power factor sensor 10 is configured such that a first magnetic element 21, which is connected with a resistor 23 in series, and a second magnetic element 22, which is connected with a resistor 24 in series, are connected in parallel (their resistance values of the resistors 23 and 24 are R2).

The first magnetic element 21 is configured such that element terminals 21a and 21b are formed at both ends of a strip-shaped magnetic film 21j and that a bias means 21c is arranged. The bias means 21c is a means for changing (rotating) magnetization formed in the magnetic film 21j of the first magnetic element 21 to an operational point relative to the orientation of a current $I_2$ flowing between the element terminals 21a and 21b. For example, the first magnetic element 21 in FIG. 2 is a permanent magnet for applying a magnetic field in the direction of arrow MF. The arrow MF is applied in the in-plane direction of the magnetic film 21j.

Similarly, the second magnetic element 22 is configured such that element terminals 22a and 22b are formed at both ends of a strip-shaped magnetic film 22j and that a bias means 22c is arranged. In the second magnetic element 22, the bias means 22c applies a bias to the current $I_2$ flowing between the element terminals 22a and 22b in the reverse direction to the bias means 21c (arrow MF'). As described below, the bias means 21c and 22c may be configured to be capable of changing the orientations of the magnetizations of the magnetic films and the currents flowing through the magnetic films, and are not limited to the means for applying a magnetic field to the magnetic films 21j and 22j as permanent magnet.

The direction from the element terminal 21a (22a) toward the element terminal 21b (22b) is called longitudinal direction of the magnetic element 21 (22). The first magnetic element 21 and the second magnetic element 22 are arranged in a direction of current $I_1$ of the connection line 8 (see FIG. 1) in the same longitudinal directions. This aims to apply a magnetic field H generated by the current $I_1$ of the connection line 8 in a plane of the magnetic film. The magnetic elements 21 and 22 are desirably arranged at equal distances from the surface of the connection line 8. This is because the magnetic field H caused by the current $I_1$ flowing through the connection line 8 is determined based on a distance from the center of the connection line 8. Conversely, if the cross-section of the connection line 8 is circular and the distances from the center of the connection line 8 are uniform, the first magnetic element 21 and the second magnetic element 22 are not necessarily arranged in a linear shape.

One end 21a of the first magnetic element 21 is connected to the sensor terminal 10ta of the power factor sensor 10. The other end 21b of the first magnetic element 21 is connected in series with the first measurement resistor 23. One end 22a of the second magnetic element 22 is connected to the sensor terminal 10ta of the power factor sensor 10. Similarly to the first magnetic element 21, the other end 22b of the second magnetic element 22 is connected in series with the second measurement resistor 24.

The first measurement resistor 23 and the second measurement resistor 24 are connected to the sensor terminal 10tb of the power factor sensor 10. That is, the first magnetic element 21 and the first measurement resistor 23 as well as the second magnetic element 22 and the second measurement resistor 24 configure a bridge circuit between one end 10ta and the other end 10tb of the power factor sensor 10.

The measurement terminals 13 are connected to the element terminals 21b and 22b of the first magnetic element 21 and the second magnetic element 22, respectively. Herein, the first measurement resistor 23 and the second measurement resistor 24 have the same resistance value, which is sufficiently higher than a resistance Rmr between the element terminals (between 21a and 21b as well as between 22a and 22b) of the magnetic elements 21 and 22.

Therefore, a gap between the measurement terminals 13a and 13b configures a differential output of the bridge circuit. Since the measurement resistors 23 and 24 are sufficiently higher in their resistance than the resistance Rmr between the element terminals of the magnetic elements 21 and 22, it is possible to consider that a constant current flow irrespective of a voltage applied between the coupling ends 12 in the power factor measurement apparatus 1.

Figure 3B:
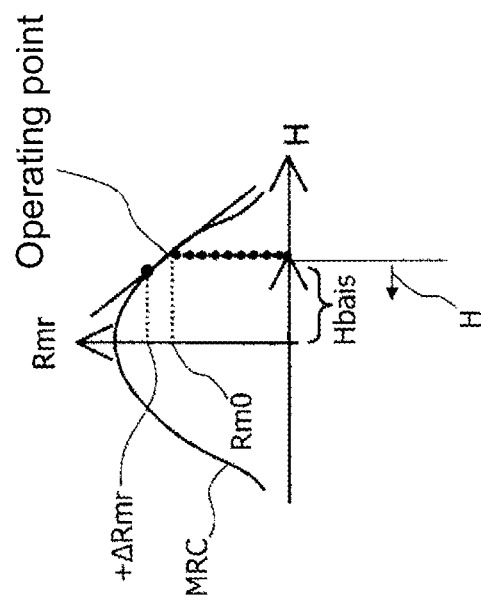
FIGS. 3(a) and 3(b) are diagrams illustrating an operation principle of a first magnetic element according to the present invention.
Figure 3A:
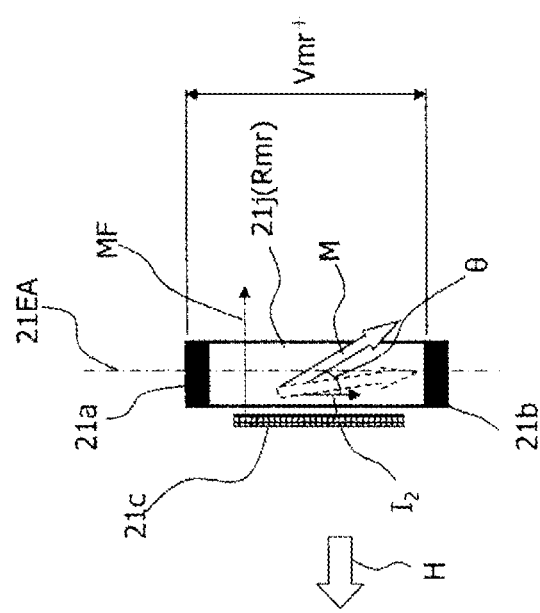

The magnetic elements 21 and 22 will be described below in detail with reference to FIGS. 3(a), 3(b) and FIGS. 4(a), 4(b). FIG. 3(a) illustrates only the first magnetic element 21. In the first magnetic element 21, a magnetization facilitating axis of the magnetic film 21j is formed in an axis 21EA direction between the element terminals 21a and 21b. In other words, the magnetization facilitating axis is induced in the longitudinal direction. FIG. 3(b) illustrates a relationship between the resistance Rmr between the element terminals 21a and 21b and the magnetic field H at in-plane right angle relative to the magnetic film 21j at this time.

In FIG. 3(b), the horizontal axis indicates the magnetic field H at in-plane right angle, and the vertical axis indicates the resistance value Rmr (Ω) in the longitudinal direction of the magnetic film 21j. Herein, the in-plane right angle direction means that a magnetic field is applied from the outside in the in-plane direction of the magnetic film 21j and at right angle relative to the axis 21EA direction. A curve MRC expressing a magnetoresistive property is an even function with the zero point of the external magnetic field as a symmetrical axis.

In the first magnetic element 21, a biased magnetic field MF is applied at right angle to the axis 21EA by the bias means 21c. The magnetization M of the magnetic film 21j is tilted by an angle θ relative to the axis 21EA due to the biased magnetic field MF (see FIG. 3(a)). Turning to FIG. 3(b), the biased magnetic field MF having a magnitude Hbais is applied to the magnetic film 21j, and thus an operational point changes by Hbais along the curve MRC. The current flowing in the first magnetic element 21 is applied between the element terminals 21a and 21b, and thus flows substantially along the axis 21EA (in the longitudinal direction).

The resistance value of the magnetic film 21j lowers to Rm0 due to the tilt θ. This point is assumed as an operational point of the first magnetic element 21. In other words, the resistance value at the operational point is Rm0.

It is assumed herein that the magnetic field H is applied in the direction of FIG. 3(a). The magnetization M is rotated in the axis 21EA direction due to the external magnetic field H, and an angle formed between the magnetization M and the current $I_2$ becomes smaller than θ. With reference to FIG. 3(b), as the angle formed between the current $I_2$ and the magnetization M becomes smaller, the resistance value of the first magnetic element 21 increases by ΔRmr (+ΔRmr).

Figures 4A, 4B:
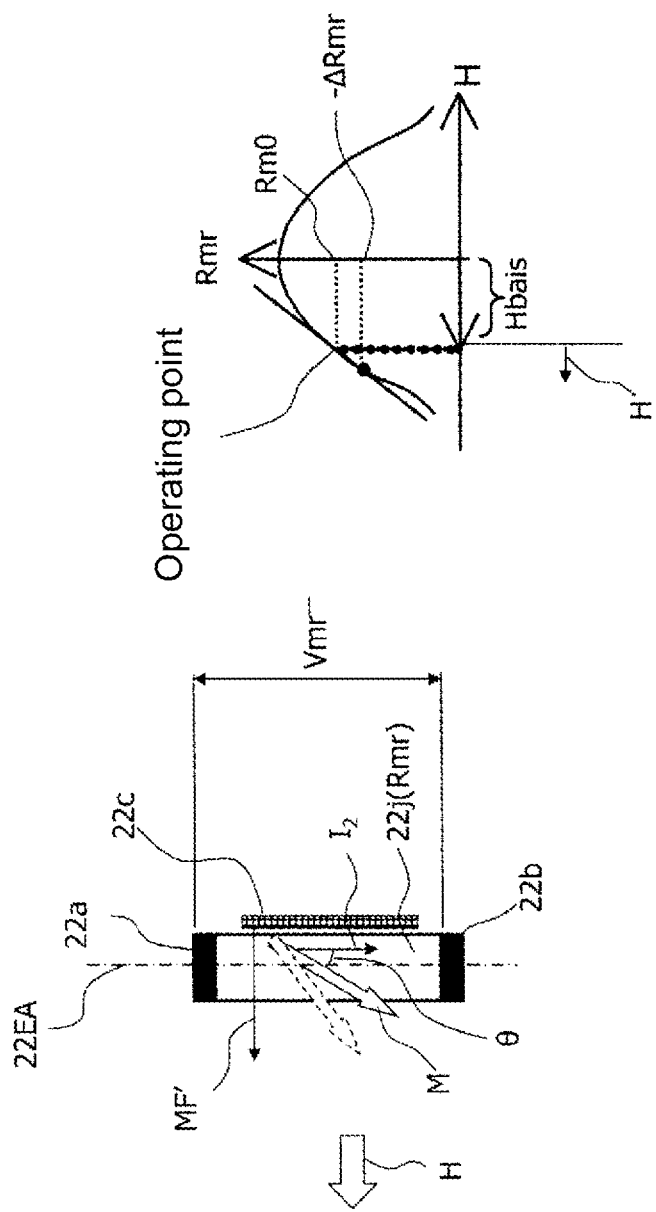
FIGS. 4(a) and 4(b) are diagrams illustrating an operation principle of a second magnetic element according to the present invention.

FIGS. 4(a) and 4(b) illustrate only the second magnetic element 22 similarly to FIGS. 3(a) and 3(b). In the second magnetic element 22, the direction of the bias means 22c is different from the bias means 21c and the current $I_2$ of the first magnetic element 21 in FIGS. 3(a) and 3(b). At first, the magnetization M is tilted by an angle θ relative to the axis 22EA direction due to the biased magnetic field MF'. The biased magnetic field MF' is different from the biased magnetic field MF in its direction, and thus the tilt direction of the magnetization M is also in reverse to FIGS. 3(a) and 3(b).

The external magnetic field H is assumed to be applied in the similar direction to FIGS. 3(a) and 3(b). The magnetization M is originally tilted in the direction in which the external magnetic field H is applied, and thus is tilted away from the axis 22EA due to the external magnetic field H. Turning to FIG. 4(b), the resistance Rmr of the second magnetic element 22 is reduced by ΔRmr (−ΔRmr) due to the external magnetic field H applied in the same direction as the biased magnetic field Hbais.

That is, the two magnetic elements 21 and 22 may be the magnetic elements having different changes in resistance relative to the external magnetic field H in the same direction. In other words, they may have different bias means, respectively.

Returning to FIG. 2 again, the two magnetic elements 21 and 22 form a bridge circuit together with the measurement resistors 23 and 24 as described above, and the measurement terminals 13a and 13b are terminals for differentially outputting the changes in resistance of the two magnetic elements 21 and 22 as the changes in voltage, respectively. The magnetic elements 21 and 22 change in their resistance values by (+ΔRmr) and (−ΔRmr) due to the external magnetic field H as described in FIGS. 3(a), 3(b) and FIGS. 4(a), 4(b), respectively.

The resistance values of the measurement resistors 23 and 24 are sufficiently higher than the resistance values of the magnetic elements 21 and 22, and the measurement resistors 23 and 24 have the same resistance, and thus the same current $I_2$ can be assumed to flow in the magnetic elements 21 and 22. An output voltage between the measurement terminals 13a and 13b is $2 \times \Delta Rmr \times I_2$.

Returning to FIGS. 3(a) and 3(b) again, the detailed output will be described by use of Equations. At first, a case with one magnetic element (first magnetic element 21) will be described.

The power factor sensor 10 is arranged near the connection line 8 of the circuit to be measured. It receives the magnetic field H generated due to a current flowing through the connection line 8. Assuming the current flowing through the connection line 8 as $I_1$, the magnetic field H applied to the magnetic film is expressed in Equation (1) with a proportional constant α.

$$H = \alpha I_1 \quad (1)$$

As illustrated in FIG. 3(b), the change ΔRmr in electric resistance of the first magnetic element 21 is proportional to the externally applied magnetic field H, and thus is expressed in Equation (2) with a proportional constant β in consideration of Equation (1).

$$\Delta Rmr = \beta H = \beta(\alpha I_1) \quad (2)$$

Assuming an electric resistance when a magnetic field is not applied to the magnetic film 21j as Rm0, the electric resistance Rm of the entire magnetic film when the magnetic field H is applied is expressed in Equation (3).

$$Rm = Rm0 + \Delta Rmr = Rm0 + \alpha\beta I_1 \quad (3)$$

That is, the magnetic film 21*j* in the power factor sensor 10 arranged near the connection line 8 in which the current $I_1$ flows has an electric resistance property as in Equation (3). When the current $I_2$ flows between the element terminals 21*a* and 21*b* of the magnetic element 21, a voltage $Vmr^+$ between the element terminals 21*a* and 21*b* is expressed in Equation (4).

$$Vmr^+ = RmI_2 = (Rm0 + \Delta Rm)I_2 = (Rm0 + \alpha\beta I_1)I_2 \qquad (4)$$

A voltage Vin of the power supply 7 (see FIG. 1), assuming an amplitude $V_1$ and an angular frequency ω, is expressed in Equation (5). The load 9 is a reactance in the circuit to be measured, and thus the current $I_1$ flowing in the load 9 is phase-shifted from the power supply voltage Vin. The phase shift is assumed as θ. On the other hand, the first magnetic element 21 in the power factor sensor 10 is at a normal resistance and is in the same phase as the power supply voltage Vin. Therefore, the currents $I_1$ and $I_2$ are expressed in Equation (6) and Equation (7), respectively.

When Equation (6) and Equation (7) are substituted into Equation (4), Equation (4) is modified into Equation (8).

As described with reference to FIG. 2, the magnetic elements 21 and 22 are connected to perform differential amplification, and have different outputs to the same magnetic field, respectively. That is, assuming a change in electric resistance of the first magnetic element 21 relative to the external magnetic field H as $\Delta Rmr$ expressed in Equation (2), a change in electric resistance of the second magnetic element 22 relative to the external magnetic field H is $(-\Delta Rmr)$. The output $Vmr^-$ of the second magnetic element 22 is expressed in Equation (9).

[Mathematical Formula 1]

$$V_{in} = V_1 \sin\omega t \qquad (5)$$

$$I_1 = \frac{V_1}{R_1}\sin(\omega t - \theta) \qquad (6)$$

$$I_2 = \frac{V_1}{R_2}\sin\omega t \qquad (7)$$

$$\begin{aligned}V_{mr}^+ &= (R_{m0} + \alpha\beta I_1)I_2 \\ &= \left(R_{m0} + \alpha\beta\frac{V_1}{R_1}\sin(\omega t - \theta)\right)\frac{V_1}{R_2}\sin\omega t \\ &= \frac{R_{m0}V_1}{R_2}\sin\omega t + \alpha\beta\frac{V_1}{R_1}\sin(\omega t - \theta)\frac{V_1}{R_2}\sin\omega t \\ &= \frac{R_{m0}V_1}{R_2}\sin\omega t + \alpha\beta\frac{V_1}{R_1}\frac{V_1}{R_2}\frac{1}{2}\{\cos\theta - \cos(2\omega t - \theta)\} \\ &= \frac{R_{m0}V_1}{R_2}\sin\omega t - \alpha\beta\frac{V_1}{R_1}\frac{V_1}{R_2}\frac{1}{2}\cos(2\omega t - \theta) + \alpha\beta\frac{V_1}{R_1}\frac{V_1}{R_2}\frac{1}{2}\cos\theta\end{aligned} \qquad (8)$$

[Mathematical Formula 2]

$$\begin{aligned}V_{mr}^- &= (R_{m0} - \alpha\beta I_1)I_2 \\ &= \left(R_{m0} - \alpha\beta\frac{V_1}{R_1}\sin(\omega t - \theta)\right)\frac{V_1}{R_2}\sin\omega t \\ &= \frac{R_{m0}V_1}{R_2}\sin\omega t - \alpha\beta\frac{V_1}{R_1}\sin(\omega t - \theta)\frac{V_1}{R_2}\sin\omega t \\ &= \frac{R_{m0}V_1}{R_2}\sin\omega t - \alpha\beta\frac{V_1}{R_1}\frac{V_1}{R_2}\frac{1}{2}\{\cos\theta + \cos(2\omega t - \theta)\} \\ &= \frac{R_{m0}V_1}{R_2}\sin\omega t + \alpha\beta\frac{V_1}{R_1}\frac{V_1}{R_2}\frac{1}{2}\cos(2\omega t - \theta) - \alpha\beta\frac{V_1}{R_1}\frac{V_1}{R_2}\frac{1}{2}\cos\theta\end{aligned} \qquad (9)$$

The output of the power factor sensor 10 is a differential output $(Vmr^+ - Vmr^-)$, and is expressed in Equation (10) based on Equation (8) and Equation (9).

[Mathematical Formula 3]

$$\begin{aligned}V_{mr}^+ - V_{mr}^- &= (R_{m0} + \alpha\beta I_1)I_2 - (R_{m0} - \alpha\beta I_1)I_2 \\ &= \left\{\frac{R_{m0}V_1}{R_2}\sin\omega t - \alpha\beta\frac{V_1}{R_1}\frac{V_1}{R_2}\frac{1}{2}\cos(2\omega t - \theta) + \alpha\beta\frac{V_1}{R_1}\frac{V_1}{R_2}\frac{1}{2}\cos\theta\right\} \\ &\quad -\left\{\frac{R_{m0}V_1}{R_2}\sin\omega t + \alpha\beta\frac{V_1}{R_1}\frac{V_1}{R_2}\frac{1}{2}\cos(2\omega t - \theta) - \alpha\beta\frac{V_1}{R_1}\frac{V_1}{R_2}\frac{1}{2}\cos\theta\right\} \\ &= -\alpha\beta\frac{V_1}{R_1}\frac{V_1}{R_2}\cos(2\omega t - \theta) + \alpha\beta\frac{V_1}{R_1}\frac{V_1}{R_2}\cos\theta\end{aligned} \qquad (10)$$

$$A = \alpha\beta\frac{V_1}{R_1}\frac{V_1}{R_2}\cos\theta = \frac{\alpha\beta}{R_2}I_1 V_1 \cos\theta \qquad (11)$$

$$\begin{aligned}B &= -\alpha\beta\frac{V_1}{R_1}\frac{V_1}{R_2}\cos(2\omega t - \theta) = -\frac{\alpha\beta}{R_2}I_1 V_1 \cos(2\omega t - \theta) \\ &= k(t) * I_1 V_1\end{aligned} \qquad (12)$$

Herein, assuming the right term in Equation (10) as "A" as in Equation (11) and the left term as "B" as in Equation (12), "A" indicates a DC component of the differential output between the magnetic elements 21 and 22 and "B" indicates an AC component of the differential output therebetween. "A" is proportional to a value obtained by multiplying the consumed power $I_1 V_1$ of the load 9 by cos θ. That is, "A" is proportional to the active power of the power consumed in the load 9. "B" is proportional to the apparent power of the consumed power in the load 9.

That is, with reference to FIG. 2, a voltage proportional to the active power in the load 9 is obtained as a DC component and a voltage proportional to the apparent power in the load 9 is obtained as an AC component between the measurement terminals 13a and 13b.

As well known, the apparent power is expressed in a complex number, in which the real number component is defined as active power, and the imaginary number component is defined as reactive power. The power factor is defined as a rate of the active power relative to the apparent power. Therefore, the power factor (cos θ) is expressed as active power/apparent power, or A/B in Equation (13).

[Mathematical Formula 4]

$$\frac{A}{B} = \frac{\frac{\alpha\beta}{R_2} I_1 V_1 \cos\theta}{k(t) * I_1 V_1} = K * \cos\theta \quad (13)$$

As a summary of the above description, the voltage (A) proportional to the active power in the load 9 is caused between the measurement terminals 13a and 13b as a DC component, and the voltage (B) proportional to the apparent power in the load 9 is caused therebetween as an AC component are caused between the measurement terminals 13a and 13b. A resultant voltage obtained by dividing "A" by "B" is obtained as a voltage proportional to the power factor.

Returning to FIG. 1 again, the outputs from the measurement terminals 13a and 13b are detected by the voltage detector (amplifier) 15, and a DC component ("A": corresponding to active power) is extracted by the low-pass filter 16. On the other hand, an AC component ("B": corresponding to apparent power) is extracted by the high-pass filter 17, and is converted into a DC voltage by the rectifier 18. Through the operation, the proportional constant K in Equation (13) can be assumed as not dependent on a power supply angular frequency ω. A/B is obtained by the divider 19. As a result, a voltage proportional to the power factor (cos θ) is obtained.

As described above, a power factor of power consumed in the inductive load 9 can be found by the power factor measurement apparatus 1 having the structure illustrated in FIG. 1.

Second Embodiment

Figure 5:
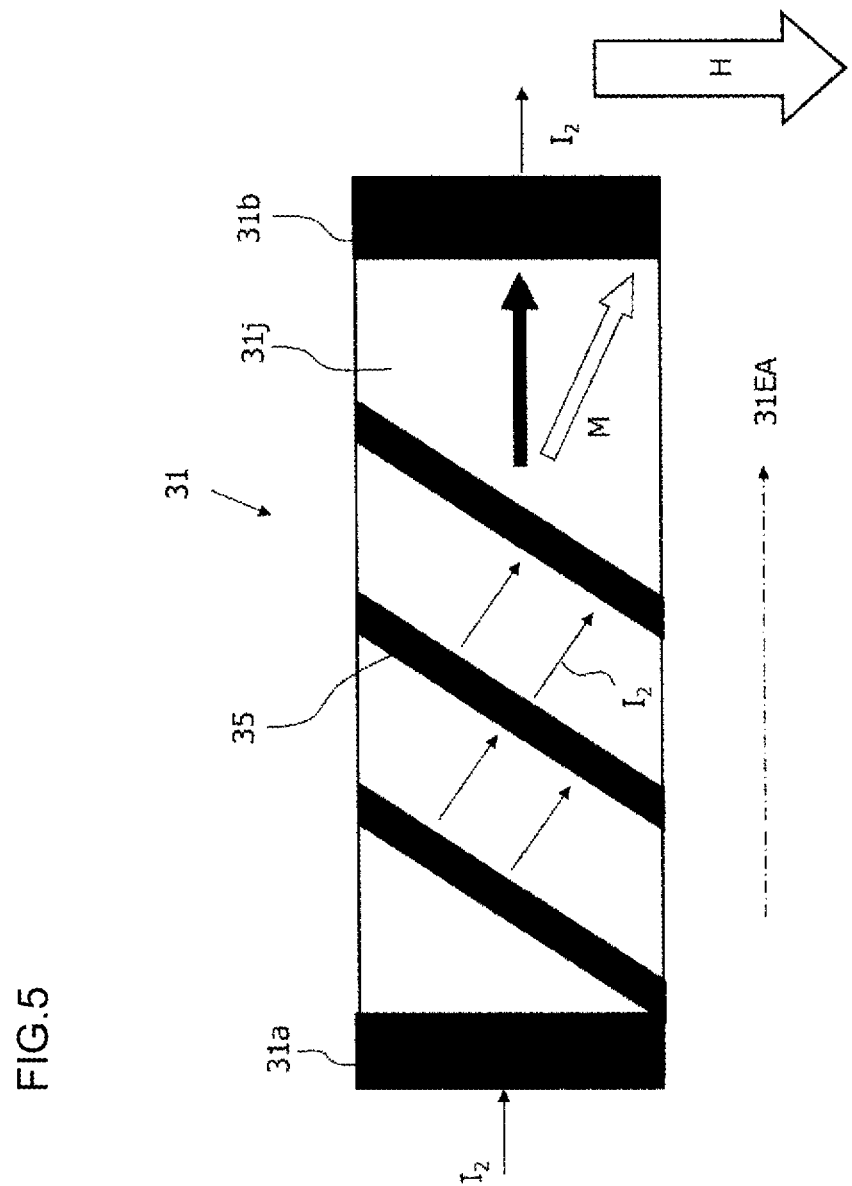
FIG. 5 is a diagram illustrating a structure of other first magnetic element.

FIG. 5 illustrates a variation of the magnetic element. As described above, the power factor measurement apparatus 1 according to the present invention can obtain a voltage proportional to a power factor by finding and dividing a DC voltage (proportional to active power) and an AC voltage (proportional to apparent power) based on a differential output in a pair of magnetic elements having the different change rates of electric resistances relative to the same external magnetic field H.

The magnetic film of the magnetic element has an even function relative to a magnetic field applied from the outside as illustrated in FIG. 3(b) and FIG. 4(b), and a resistance value thereof proportional to the applied magnetic field cannot be obtained by itself. Thus, in the magnetic elements 21 and 22, the magnetic field generating sources such as permanent magnet are arranged as the bias means 21c and 22c near the magnetic films 21j and 22j, respectively, thereby generating a biased magnetic field and obtaining an operational point. However, even if a magnetic field generating source such as magnet is not employed, an operational point may be obtained.

FIG. 5 illustrates other form of the first magnetic element 21 (first magnetic element 31). A stripe-patterned conductor 35 is formed on a magnetic film 31j. A magnetization facilitating axis 31EA is induced in the longitudinal direction in the magnetic film 31j. The conductor 35 is preferably made of a material with a sufficiently lower electric resistance than the magnetic film 31j. Specifically, a highly conductive material such as copper, aluminum, silver or gold is suitably employed. A plurality of conductors 35 are tilted and formed in a constant direction relative to the longitudinal direction.

The operations of the magnetic element 31 will be described in correspondence to FIGS. 3(a) and 3(b). The current $I_2$ flows between element terminals 31a and 31b. The current $I_2$ input from the element terminal 31a has to flow on the magnetic film 31j when flowing between the stripe-patterned conductors 35. This is because only the magnetic film 31j is conductive.

The magnetic film 31j is higher in resistance than the conductors 35, and thus the current $I_2$ flows in the shortest distance between the conductors 35. As viewed in the longitudinal direction of the magnetic film 31j, the current flows in the tilted direction. The magnetization facilitating axis 31EA of the magnetic film 31j is induced in the longitudinal direction of the first magnetic element 31, and thus the orientations of the magnetization M and the current $I_2$ are tilted.

When the magnetic field H is applied on the magnetic film 31j downward from the sheet, the magnetization M is accordingly rotated (white arrow in solid line). Then, an angle formed between the rotated magnetization M and the current $I_2$ becomes smaller, and the resistance of the magnetic film 31j becomes higher. That is, similarly to FIGS. 3(a) and 3(b), a change in electric resistance +ΔRmr is indicated.

Figure 6:
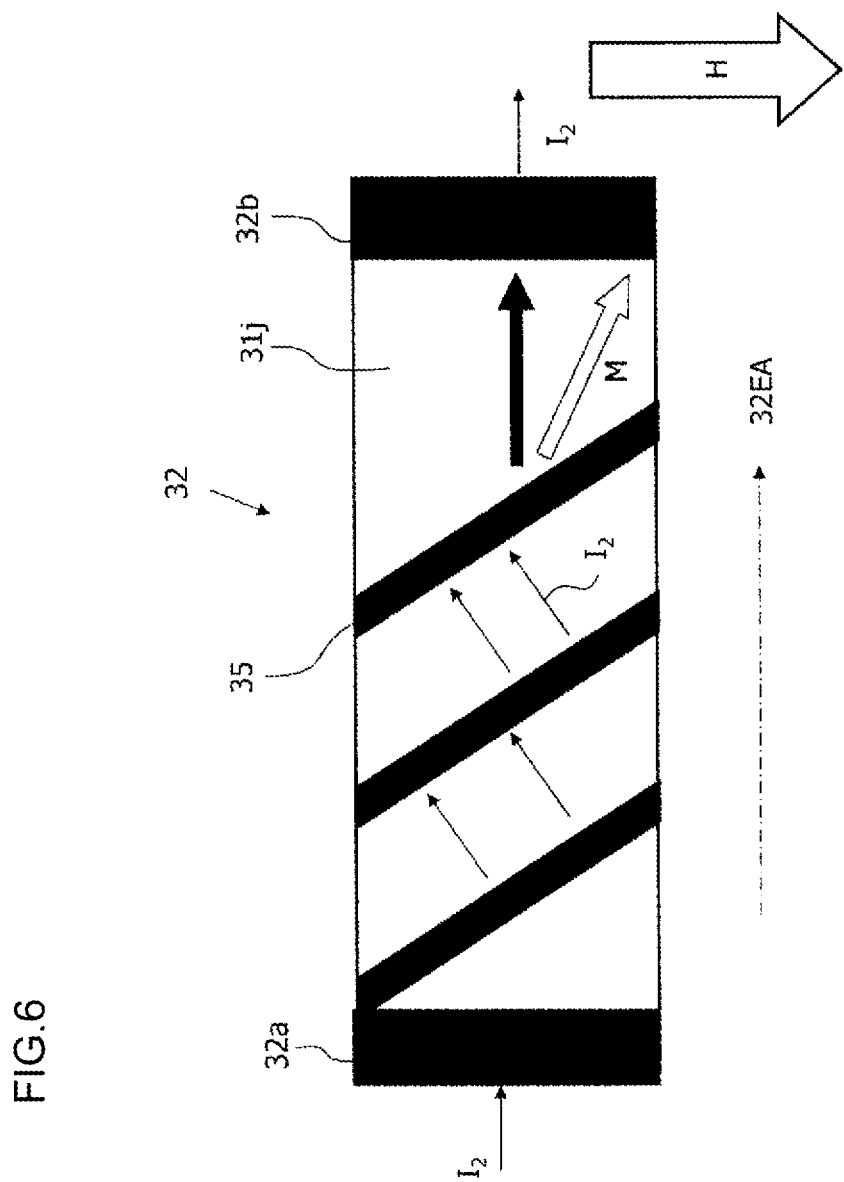
FIG. 6 is a diagram illustrating a structure of other second magnetic element.

FIG. 6 illustrates a case in which the stripe-patterned conductor 35 is formed in the reverse direction to FIG. 5. The orientation of the current $I_2$, the orientation of a magnetization facilitating axis 32EA, and the orientation of the externally applied magnetic field H are the same as FIG. 5. In FIG. 6, the magnetization M (arrow in solid line) rotates away from the current $I_2$ due to the magnetic field H applied downward from the sheet. Similarly to FIGS. 4(a) and 4(b), the electric resistance changes to be lower. That is, similarly to FIGS. 4(a) and 4(b), a change in electric resistance (−ΔRmr) is indicated.

In this way, when the direction of the flowing of the current $I_2$ and the direction of the magnetization M are previously angled while a magnetic field is not applied from the outside, the same state as a biased magnetic field is applied is apparently caused. That is, the structure of the magnetic film 31j (or 32j) and the conductor 35 may form a bias means 31c (or 32c).

FIG. 5 and FIG. 6 illustrate the structure in which the current $I_2$ flowing direction is different from the directions of the magnetization facilitating axes 31EA and 32EA, but the magnetization facilitating axes 31EA and 32EA may be previously angled in the longitudinal direction of the magnetic film 31j (or 32j) to be induced (see Third Embodiment).

Figure 7:
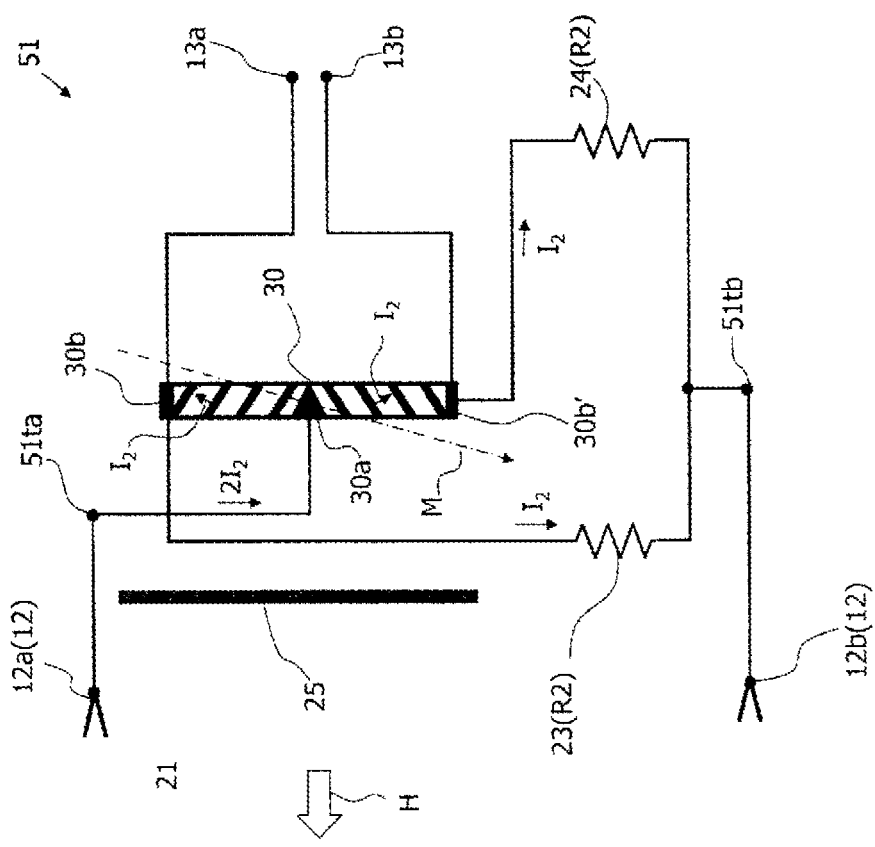
FIG. 7 is a diagram illustrating a structure of a power factor sensor using a barber pole type magnetic element.

FIG. 7 illustrates a magnetic element 30 formed in a combination of FIG. 5 and FIG. 6. A power factor sensor including the magnetic element 30 is indicated as reference numeral 51. The magnetic element 30 has an element terminal 30a connected to a sensor terminal 51ta in the power factor sensor 10, an element terminal 30b connected to the first measurement resistor 23, and an element terminal 30b' connected to the second measurement resistor 24.

The element terminal 30a may be called center tap. In the magnetic element 30, the formation direction of the stripe-patterned conductor 35 in the direction from the element terminal 30a to the element terminal 30b (called "b" direction) is different from the formation direction of the stripe-patterned conductor 35 in the direction from the element terminal 30a to the element terminal 30b' (called "b" direction). Therefore, the current $I_2$ flowing on the magnetic film 30j flows different in the b direction and in the b' direction.

Assuming that the external magnetic field H is applied on the magnetic element 30 and the magnetization M rotates as in FIG. 7, the orientation of the magnetization M from the current $I_2$ and that of the current from the current $I_2$ are the same in the b direction, and thus the electric resistance increases (−ΔRmr) similarly to FIGS. 3(a) and 3(b). On the other hand, the orientations of the magnetization M and the current are away from each other from a view of the current $I_2$ flowing in the b' direction, and thus the electric resistance decreases (−ΔRmr) similarly to FIGS. 4(a) and 4(b).

The sufficiently high measurement resistors 23 and 24 are connected in series in the b direction and b' direction, and the measurement resistors 23 and 24 are connected to the terminal 10tb in the power factor sensor 10. Thus, the power factor sensor 51 including the magnetic element 30 illustrated in FIG. 7 forms a bridge circuit similarly to FIG. 2, and a differential output between the b direction and the b' direction appears between the measurement terminals 13a and 13b.

Figure 8:
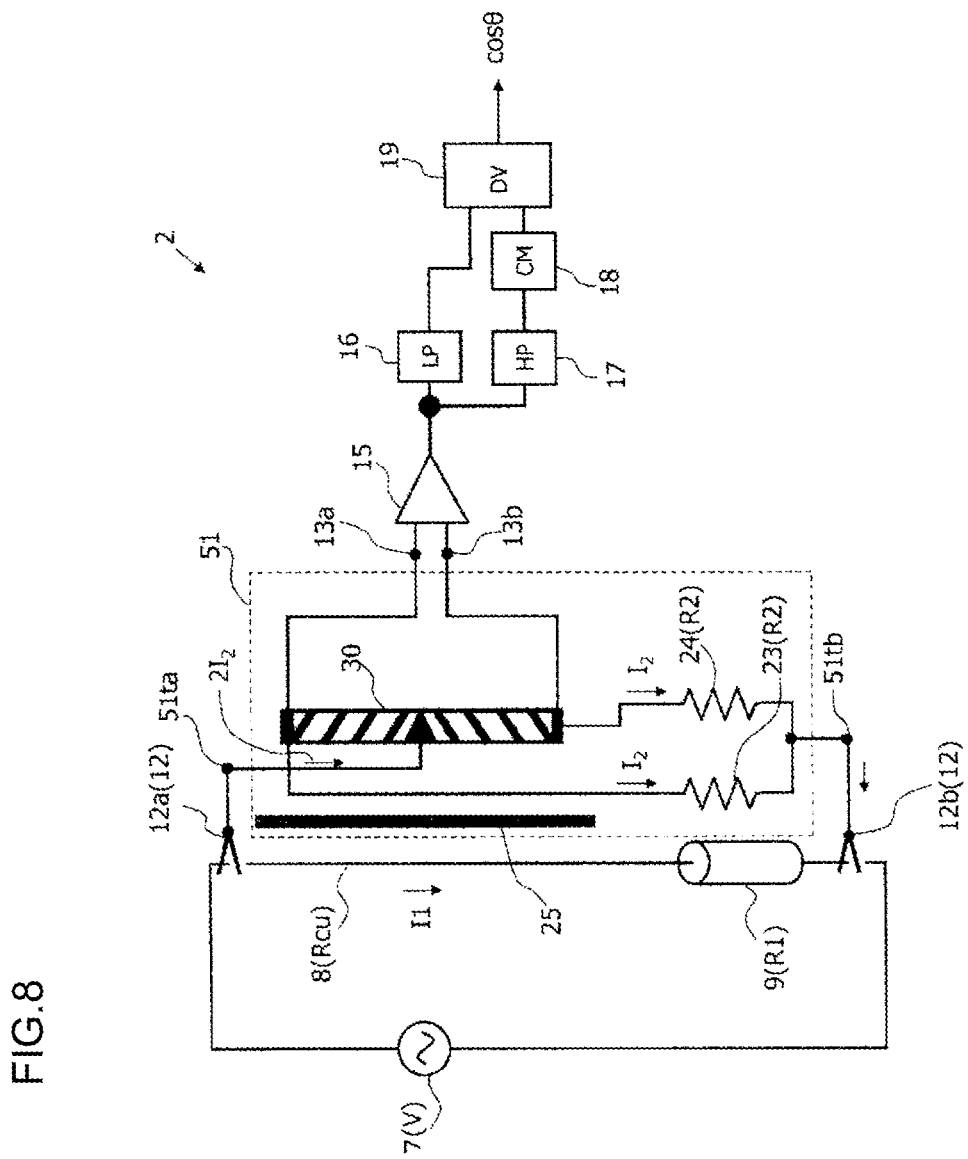
FIG. 8 is a diagram illustrating a structure of a power factor measurement apparatus using a barber pole type magnetic element.

FIG. 8 illustrates a structure of a power factor measurement apparatus 2 having the power factor sensor 51. The measurement terminals 13a and 13b are assumed as outputs, and the voltage detector 15, the low-pass filter 16, the high-pass filter 17, the rectifier 18 and the divider 19 are the same as the first embodiment. The power factor sensor 51 illustrated in the present embodiment does not require a magnetic field generating source such as permanent magnet for a bias means, and thus can be reduced in its size and film thickness. The magnetic elements 31 and 32 are formed at the same time in the b direction and the b' direction in the magnetic element 30, but may be separately formed and coupled via a conductive wire.

Third Embodiment

Figure 9:
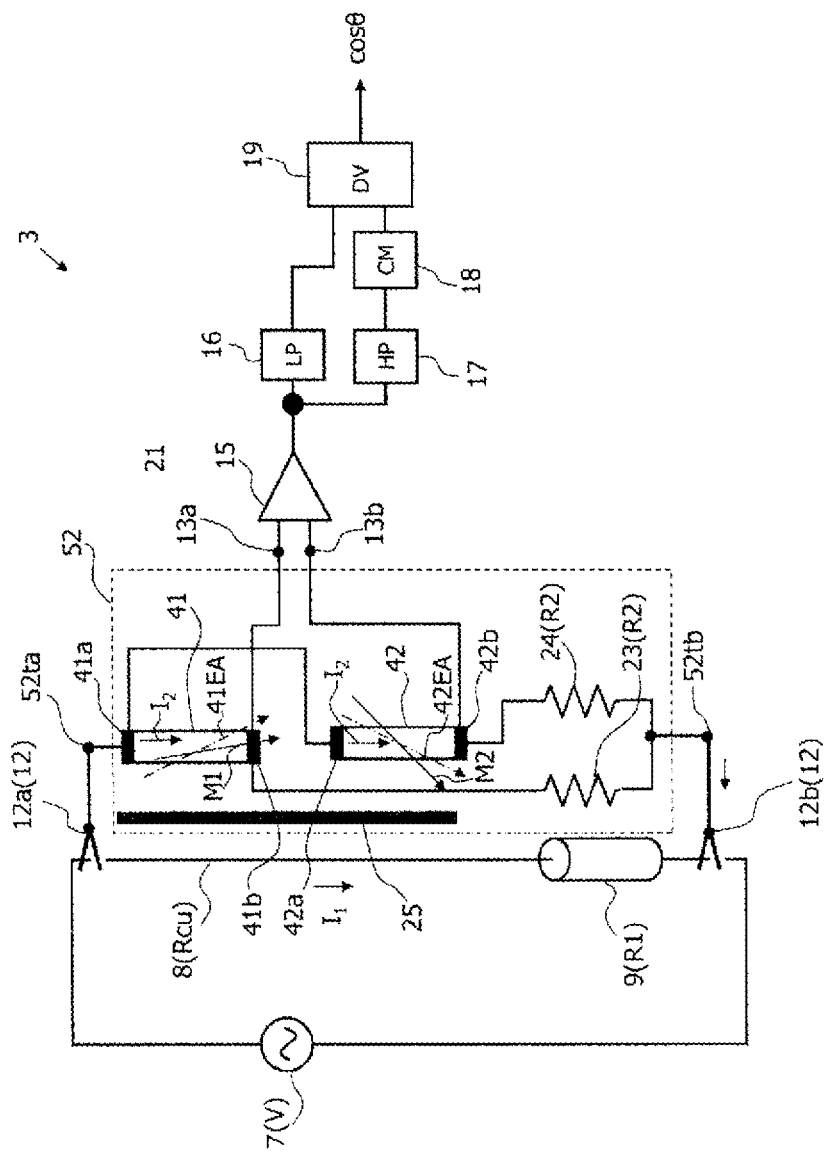
FIG. 9 is a diagram illustrating a structure of a power factor measurement apparatus using other magnetic element.

FIG. 9 illustrates a structure of a power factor measurement apparatus 3 according to the present embodiment. The same parts as the first and second embodiments are denoted as the same reference numerals, and the description thereof will be omitted. The power factor measurement apparatus 3 according to the present embodiment is characterized by magnetic elements 41 and 42. In the magnetic elements 41 and 42, magnetization facilitating axes 41EA and 42EA are tilted and induced toward the longitudinal directions, respectively. Further, the magnetization facilitating axes of the magnetic elements 41 and 42 are induced in the different directions relative to the current $I_2$ flowing on the magnetic films, respectively.

With such structure, the magnetizations M of the magnetic elements 41 and 42 rotate as M1 and M2 due to the magnetic field H generated by the current $I_1$ flowing in the circuit to be measured, respectively. The orientations of the current $I_2$ flowing in the magnetic elements 41 and 42 are between the element terminals (between 41a and 41b and between 42a and 42b: longitudinal direction), and thus the relationships between the orientation of the current and the orientation of the magnetization in the magnetic elements 41 and 42 are different like an approaching direction and a separated direction, respectively.

In this case, similarly to the first and second embodiments, in the magnetic elements 41 and 42, the electric resistances increase (+ΔRmr) and decrease (−ΔRmr), respectively. The signal processing subsequent to the above are similar to the first and second embodiments, and a voltage proportional to the power factor cos θ can be obtained.

As described above, the power factor measurement apparatus 3 according to the present invention can measure a power factor of consumed power in the inductive load 9 in the circuit to be measured as a voltage value. This is remarkably advantageous in power control of a load changing in its power factor in a drive state.

INDUSTRIAL APPLICABILITY

The present invention can be widely used in controlling an inductive load (reactance) in the field of home electric appliances, the field of automobiles, the field of industrial equipment, and the like.

REFERENCE SIGNS LIST 1, 2, 3: Power factor measurement apparatus
7: Power supply
8: Connection line (resistor)
9: Load
10: Power factor sensor
10t (10ta, 10tb): Sensor terminal
12 (12a, 12b): Coupling end
13 (13a, 13b): Measurement terminal
15: Voltage detector
16: Low-pass filter
17: High-pass filter
18: Rectifier
19: Divider
21: First magnetic element
21a, 21b: Element terminal (of first magnetic element)
21c: Bias means (of first magnetic element)
21j: Magnetic film (of first magnetic element)
21EA: Magnetization facilitating axis (of first magnetic element)
22: Second magnetic element
22a, 22b: Element terminal (of second magnetic element)
22c: Bias means (of second magnetic element)
22j: Magnetic film (of second magnetic element)
22EA: Magnetization facilitating axis (of second magnetic element)
23: First measurement resistor
24: Second measurement resistor
25: Insulative layer
31: First magnetic element
31a, 31b: Element terminal (of first magnetic element)

31*j*: Magnetic film of (first magnetic element)
31EA: Magnetization facilitating axis (of first magnetic element)
32: Second magnetic element
32*a*, 32*b*: Element terminal (of second magnetic element)
32*j*: Magnetic film (of second magnetic element)
32EA: Magnetization facilitating axis (of second magnetic element)
41: First magnetic element
41*a*, 41*b*: Element terminal (of first magnetic element)
41*j*: Magnetic film (of first magnetic element)
41EA: Magnetization facilitating axis (of first magnetic element)
42: Second magnetic element
42*a*, 42*b*: Element terminal (of second magnetic element)
42*j*: Magnetic film (of second magnetic element)
42EA: Magnetization facilitating axis (of second magnetic element)
51, 52: Power factor sensor
51*t* (51*ta*, 51*tb*), 52*t* (52*ta*, 52*tb*): Sensor terminal

The invention claimed is:

1. A power factor measurement apparatus that measures a power factor of power consumed at a load connected to a power source via a connection line, the apparatus comprising:
   a power factor sensor connected with the load in parallel, the power factor sensor being supplied with a current from the power source connected with the load, the power factor sensor comprising first and second magnetic elements, resistance changes of the first and second magnetic elements due to an identical external magnetic field being different from each other;
   a voltage detector configured to detect a differential voltage between the first and second magnetic elements; and
   a power factor calculator that calculates the power factor based on the differential voltage, wherein the power factor calculator comprises:
      a low pass filter connected with an output of the voltage detector;
      a high pass filter connected with the output of the voltage detector;
      a rectifier connected with an output of the high pass filter; and
      a divider that divides an output of the low pass filter by an output of the rectifier.

2. The apparatus of claim 1, wherein
   a first end of each of the first and second magnetic elements is connected with a first end of the load, and
   a second end of each of the first and second magnetic elements is connected with each of inputs of the voltage detector.

3. The apparatus of claim 2, wherein the second end of each of the first and second magnetic elements is connected with a second end of the load via a measurement resistance.

4. The apparatus of claim 1, wherein the power factor sensor further comprises first and second measurement resistances connected with the first and second magnetic elements, respectively, and
   the first and second magnetic elements and the first and second measurement resistances form a bridge circuit parallel to the load.

5. The apparatus of claim 1, wherein, due to an external magnetic field, when a resistance of the first magnetic element increases, a resistance of the second magnetic element decreases.

6. The apparatus of claim 5, wherein, due to the external magnetic field, an increase amount of the resistance of the first magnetic element is substantially equal to a decrease amount of the second magnetic element.

7. The apparatus of claim 1, wherein each of the first and second magnetic elements is arranged so that longitudinal direction thereof is substantially parallel to the connection line.

8. The apparatus of claim 1, wherein the resistance changes of the first and second magnetic elements are substantially constant with regard to a variation of the external magnetic field.

9. A power factor measurement apparatus that measures a power factor of power consumed at a load connected to a power source via a connection line, the apparatus comprising:
   a power factor sensor connected with the load in parallel, the power factor sensor being supplied with a current from the power source connected with the load, the power factor sensor comprising first and second magnetic elements, resistance changes of the first and second magnetic elements due to an identical external magnetic field being different from each other;
   a voltage detector configured to detect a differential voltage between the first and second magnetic elements; and
   a power factor calculator that calculates the power factor based on the differential voltage, wherein
   the first magnetic element comprises:
      a strip-shaped first magnetic film;
      a first pair of element terminals at both ends of the first magnetic film; and
      a first bias module that applies a magnetic field parallel to a face of the first magnetic film, there being a first angle between a direction of the first magnetic field and a direction of a current flowing between the first pair of element terminals, and the second magnetic element comprises:
      a strip-shaped second magnetic film;
      a second pair of element terminals at both ends of the second magnetic film; and
      a second bias module that applies a magnetic field parallel to a face of the second magnetic film, there being a second angle between a direction of the second magnetic field and a direction of a current flowing between the second pair of element terminals, and
   the first angle is different from the second angle.

10. A power factor measurement apparatus that measures a power factor of power consumed at a load connected to a power source via a connection line, the apparatus comprising:
   a power factor sensor connected with the load in parallel, the power factor sensor being supplied with a current from the power source connected with the load, the power factor sensor comprising first and second magnetic elements, resistance changes of the first and second magnetic elements due to an identical external magnetic field being different from each other;
   a voltage detector configured to detect a differential voltage between the first and second magnetic elements; and
   a power factor calculator that calculates the power factor based on the differential voltage, wherein the first magnetic element comprises:
: a strip-shaped first magnetic film;
: a first pair of element terminals at both ends of the first magnetic film; and
: a first plurality of conductors on a face of the first magnetic film, there being a first angle between a direction between the first pair of element terminals and a direction of the first plurality of conductors, and the second magnetic element comprises:
: a strip-shaped second magnetic film;
: a second pair of element terminals at both ends of the second magnetic film; and
: a second plurality of conductors on a face of the second magnetic film, there being a second angle between a direction between the second pair of element terminals and a direction of the second plurality of conductors, and
: the first angle is different from the second angle.

11. A power factor measurement apparatus that measures a power factor of power consumed at a load connected to a power source via a connection line, the apparatus comprising:
: a power factor sensor connected with the load in parallel, the power factor sensor being supplied with a current from the power source connected with the load, the power factor sensor comprising first and second magnetic elements, resistance changes of the first and second magnetic elements due to an identical external magnetic field being different from each other;
: a voltage detector configured to detect a differential voltage between the first and second magnetic elements; and
: a power factor calculator that calculates the power factor based on the differential voltage,
: wherein an angle between a magnetization facilitating axis of the first magnetic element and a direction of a current flowing in the first magnetic elements is different from an angle between a magnetization facilitating axis of the second magnetic element and a direction of a current flowing in the second magnetic element.

12. A power factor measurement method to measure a power factor of power consumed at a load connected to a power source via a connection line, the method comprising:
: detecting a differential voltage between first and second magnetic elements of a power factor sensor connected with the load in parallel, the power factor sensor being supplied with a current from the power source connected with the load, resistance changes of the first and second magnetic elements due to an identical external magnetic field being different from each other; and
: calculating the power factor based on the differential voltage,
: wherein calculating the power factor comprises:
:: retrieving a low frequency component from the differential voltage;
:: retrieving a high frequency component from the differential voltage;
:: rectifying the high frequency component; and
:: dividing the low frequency component by the rectified high frequency component.

* * * * *

UNITED STATES PATENT AND TRADEMARK OFFICE
CERTIFICATE OF CORRECTION

PATENT NO. : 10,120,001 B2
APPLICATION NO. : 14/400023
DATED : November 6, 2018
INVENTOR(S) : Hiroaki Tsujimoto It is certified that error appears in the above-identified patent and that said Letters Patent is hereby corrected as shown below:

In the Specification

Column 11, Line 28, "increases $(-\Delta Rmr)$" should read --increases $(+\Delta Rmr)$--

Signed and Sealed this
Twenty-second Day of January, 2019

Andrei Iancu
*Director of the United States Patent and Trademark Office*